United States Patent [19]

Nugent

[11] Patent Number: 5,557,075
[45] Date of Patent: Sep. 17, 1996

[54] PARALLEL FLEXIBLE TRANSMISSION CABLE

[75] Inventor: Steven F. Nugent, Portland, Oreg.

[73] Assignee: Intel Corporation, Sanat Clara, Calif.

[21] Appl. No.: 266,150

[22] Filed: Jun. 27, 1994

[51] Int. Cl.⁶ ..................................................... H05K 1/02
[52] U.S. Cl. ..................... 174/254; 174/268; 174/35 R; 333/1; 361/816; 361/827; 361/799
[58] Field of Search .................................. 361/749, 826, 361/827, 799, 800, 788, 816; 333/1; 174/254, 268, 261, 255, 35 R; 439/67, 77

[56] References Cited

U.S. PATENT DOCUMENTS

| | | | |
|---|---|---|---|
| 4,730,146 | 3/1988 | Maser et al. | 313/511 |
| 4,902,236 | 2/1990 | Hasireoglu | 439/77 |
| 4,934,943 | 6/1990 | Klein et al. | 439/65 |
| 5,195,897 | 3/1993 | Kent et al. | 439/67 |
| 5,479,110 | 12/1995 | Crane et al. | 324/757 |

*Primary Examiner*—Laura Thomas
*Attorney, Agent, or Firm*—Blakely, Sokoloff, Taylor & Zafman

[57] ABSTRACT

A parallel flexible transmission cable accommodating three degrees of displacement and one degree of rotation. The cable has two connectors attached to a flexible, planar cable. A plurality of conductors in the planar cable electrically connect corresponding pins of the two conductors. The cable is bent or formed in the middle of its length to be composed solely of a vane or vanes, that is, planar sections which project othogonally to the common plane of the cable at the connectors. The vanes can flex cooperatively into parallel "S" shapes, allowing the connectors to move transversely with respect to each other. The cable can be made from different normally-planar materials such as flexible circuit boards, or "flex circuits," or ribbon cable.

19 Claims, 10 Drawing Sheets

PARALLEL FLEXIBLE TRANSMISSION CABLE

TECHNICAL FIELD

The present invention pertains to the field of parallel cables for transmitting electrical signals.

BACKGROUND ART

In many electronic systems there is a need to interconnect high-performance parallel buses or assemblies. A parallel computing system having a plurality of processors, where processors are located on separate circuit assemblies, is an example of this need. The circuit assemblies may be in the same cabinet or in different cabinets. In either case, the assemblies may not be precisely located with respect to each other.

Assemblies may be displaced with respect to each other in a variety of ways. One type of displacement is where the assemblies are parallel, but are not coplanar. A second type of displacement is where the assemblies are not parallel. A third type of displacement is a variation in distance between the assemblies. A fourth type of displacement is a lateral misalignment between the assemblies.

Presently, parallel cables are being used to interconnect such circuit assemblies. Their flexibility accommodates a limited amount of non-coplanarity, nonparallel variations, displacement variations, and transverse misalignment.

Figure 1:
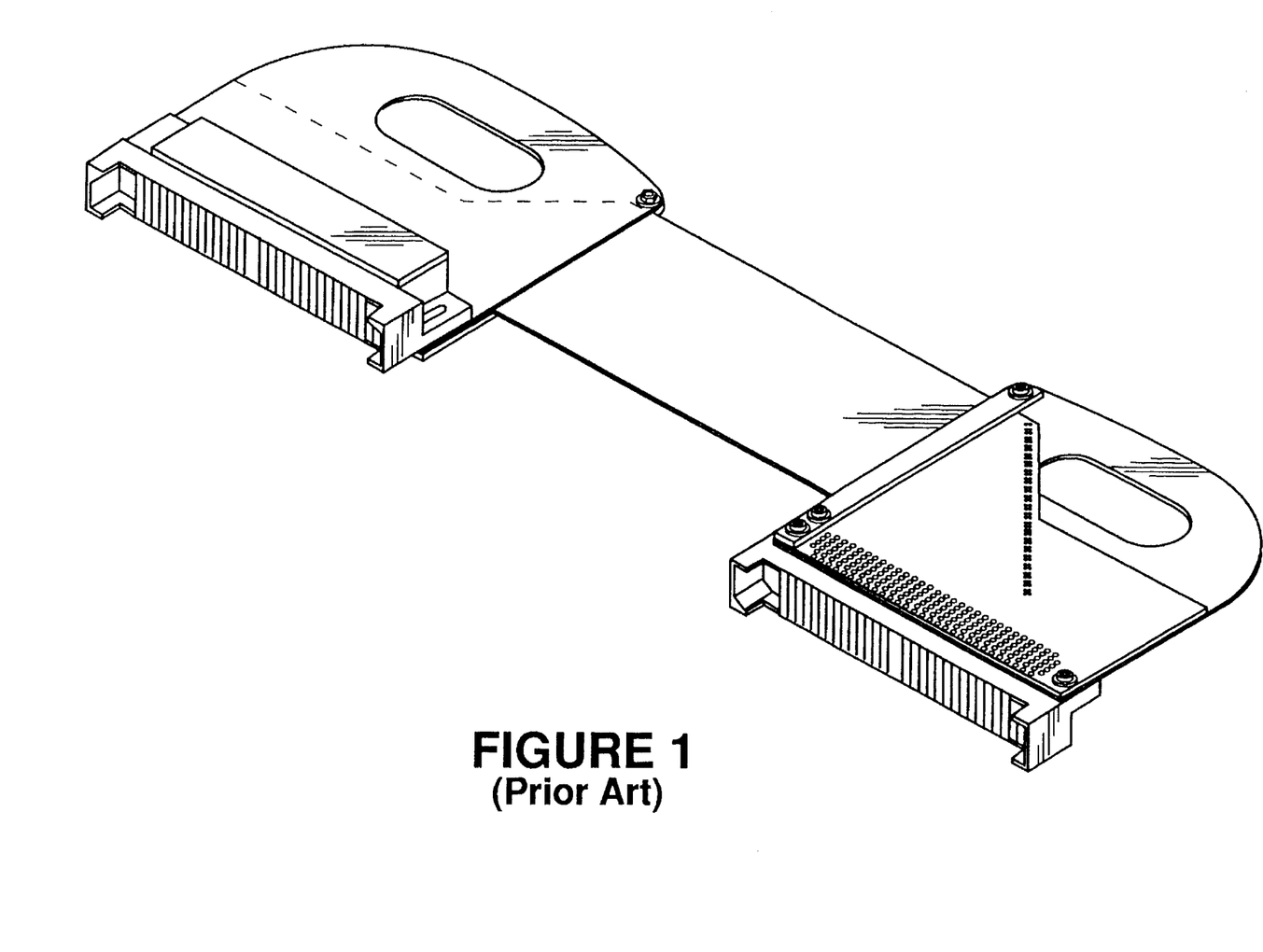
FIG. 1 is a perspective view of a prior art parallel transmission cable.

A prior art parallel cable is shown in FIG. 1. The cable uses a four-layer flexible circuit board ("flex circuit") as its major component to transmit electrical signals between respective pins of its two connectors. The flex circuit's inner two layers have conductive traces that transmit electrical signals. Its outer two layers are solid copper ground planes that provide current return paths and constant impedance for the signal traces. The cable's flex circuit portion can be bent into a "U" or "S" shape so that its connectors are properly positioned for mating connectors on two circuit assemblies to be interconnected.

The cable shown in FIG. 1 has a variety of disadvantages. The cable is fairly stiff, preventing its connectors from being easily mated and unmated with mating connectors one at a time. If the cable connects circuit assemblies in different cabinets, mating and unmating the connectors can be especially inconvenient. Furthermore, if the mating connectors on the two circuit assemblies to be interconnected are not coplanar, the cable and its connectors are under continual stress. The cable is fairly tall, and not in the plane of the circuit assemblies it interconnects. Therefore, it requires a relatively large cabinet to contain it. The cable also is likely to block cooling airflow.

When the cable is configured to provide a "service loop" and positioned for mating it must be formed into a "U" shape which makes its length relatively long for the distance it spans. As crosstalk and electrical interference are proportional to a cable's length, a shorter cable is preferred.

What is desired is a parallel transmission cable which is relatively flexible, allowing its connectors to be independently mated and unmated, which is relatively short for the distance it spans, which accommodates variation in displacement between mating connectors, and which is relatively compact to allow increased cooling airflow and decreased size requirements, yet maintains controlled electrical transmission characteristics.

SUMMARY OF THE INVENTION

A parallel flexible transmission cable according to the present invention includes a pair of connectors that are adapted to connect to respective mating connectors. The connectors are attached to opposite ends of a flexible cable having a plurality of conductors; the conductors electrically connect respective pins on the connectors.

First and second portions of the cable's length near the two connectors are substantially planar, thereby allowing the cable to bend along lines transverse to the length of the cable. The connectors need not be, but may be, in the same plane.

Between these first and second substantially planar portions is a third portion of the flexible cable that is also substantially planar. The plane of the third portion is orthogonal to the planes of the first and second portions, and is also orthogonal to the longitudinal axis of the cable. The cable can flex in this third portion in a direction which is orthogonal to the bending possible in the first and second portions.

As a feature of the present invention, the third, intermediate portion of the cable can be split between a plurality of parallel planes, or "vanes." All of these vanes are parallel to each other and are orthogonal to the "common plane" of the cable at the connectors.

As another feature, the cable can be made from various substantially planar materials. Two such materials are flexible circuit board and ribbon cable. When using flexible circuit board, the cable may be a four-layer stack-up, with the two outer layers serving as ground planes and the inner two layers serving as routing layers.

Whether constructed from flexible circuit board or ribbon cable, the conductors of the cable may be fabricated to be substantially all the same length, ensuring that the signal transmission time is virtually the same for each conductor.

These and other features, advantages, and objects of the present invention will be made more clear when considering the following specification when taken in conjunction with the appended drawings.

DETAILED DESCRIPTION OF THE INVENTION

Referring now to the drawings, and first to FIGS. 2–5, an exemplary parallel flexible transmission cable according to the present invention includes a four-layer flexible circuit board ("flex circuit") 30. Located at respective ends 32, 34 of the flex circuit are two connectors 36, 38. The connectors are adapted to mate to corresponding mating connectors (not shown) on the two circuit assemblies to be electrically connected by the cable. As will be described below, conductors within the flex circuit transmit electrical signals between respective pins of the cable's two connectors.

The flex circuit 30 includes a plurality of "vanes" 40 which project orthogonally from a common plane 41 of the flex circuit 30. A "comb" stabilizer 42 holds the vanes parallel to, and equidistant from, each other. As shown best in FIG. 5, the stabilizer has "teeth" 44 on each side of each vane to hold the vanes in place.

The parallel flexible transmission cable can be classified into four regions along its length. (The length of the cable is the dimension between its ends 32, 34. Depending on the number of conductors in the cable and the distance to be spanned, the cable may be wider than it is long.) A "connector region" 46 is a portion of the cable where the flex circuit 30 and the connectors 36, 38 join each other. A "vane region" 48 is another portion of the cable's length where the flex circuit preferably is composed solely of the parallel vanes 40. A "transition region" 50 is located between the connector region and the vane region and is another portion of the cable's length where some of the flex circuit is in both the common plane 41 and the vanes 40. Between the connector region 48 and the transition region 50 is a "planar region" 52 where the flex circuit is within the common plane 41 yet does not abut the connectors.

Figure 3:
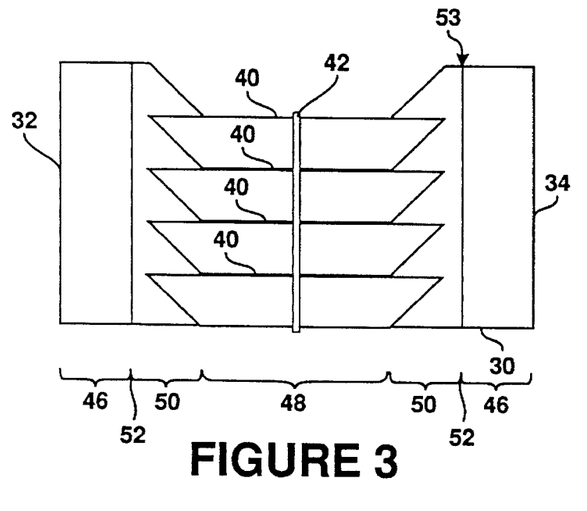
FIG. 3 is a plan view of the cable.
Figure 6:
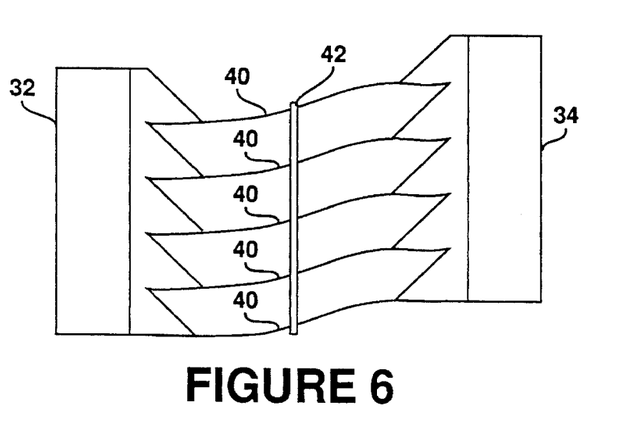
FIG. 6 is a plan view of the cable showing the ends of the cable laterally displaced from each other.

Referring now to FIGS. 3 and 6, the parallel vanes 40 can bend concurrently in similar "S" shapes within the vane region 48, thereby allowing the connectors 36, 38 to move laterally with respect to the length of the cable. This lateral movement allows the cable to adapt to a lateral misalignment of, or a variation in distance between, the two mating connectors (not shown) to which the cable mates; the cable flexes to accommodate the misalignment or distance variation.

Figure 4:
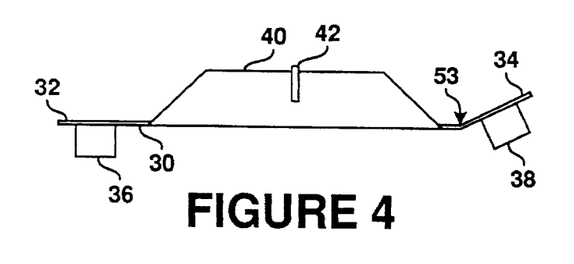
FIG. 4 is a side view of the cable.
Figure 5:
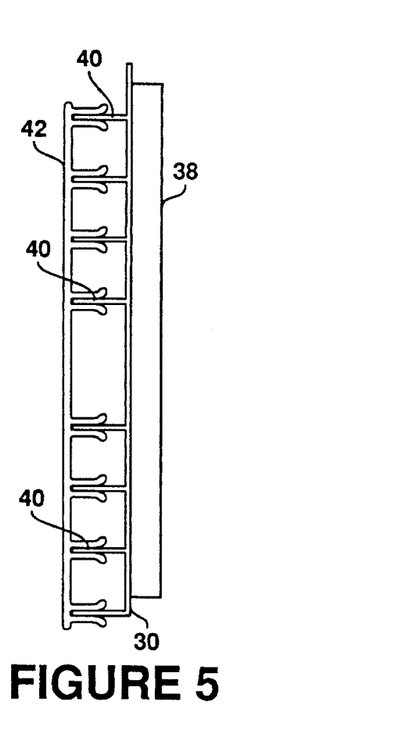
FIG. 5 is an end view of the cable.

Referring now to FIGS. 3–4, within the planar region 52, the flex circuit 30 can bend along a bend line 53 transverse to the length of the cable. Thus, the connectors 36, 38 need not remain coplanar; they can connect to mating connectors (not shown) on different planes.

The bending of the flex circuit 30 in one direction within its vane region 48 and in another direction within its planar region 52 allows the connectors 36, 38 to move independently of each other with three degrees of displacement and one degree of rotation. Because of this, the connectors can be independently mated and unmated from respective connectors on the assemblies to be bridged without undue stress on the cable or assemblies.

Figure 7:
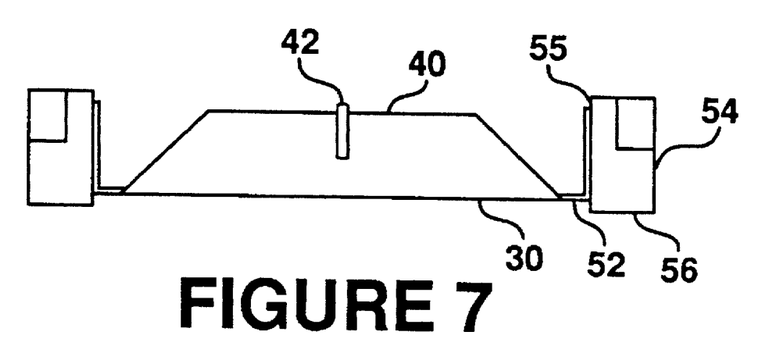
FIGS. 7 and 8 are side views of the cable having right-angle connectors with the flex circuit assembly being bent upward and downward, respectively.

The connectors 36, 38 shown in FIGS. 2–6 are termed "stacking" connectors. That is, they are designed to mate two boards that are substantially parallel. Referring now to FIG. 7, a cable according to the present invention can be constructed using "right-angle" connectors. Right-angle connectors are designed to mate two boards in orthogonal planes. In such a case, the flex circuit 30 may be bent upward at a right angle within the planar region 52 (FIG. 3) and attached to the side 55 of the right-angle connectors 54. The bottoms 56 of the right-angle connectors 54 are adapted to connect with mating connectors (not shown). The use of right-angle connectors results in a very low-profile cable. Systems built using such a cable can be more compact, have better cooling air flow, or both.

Figure 8:
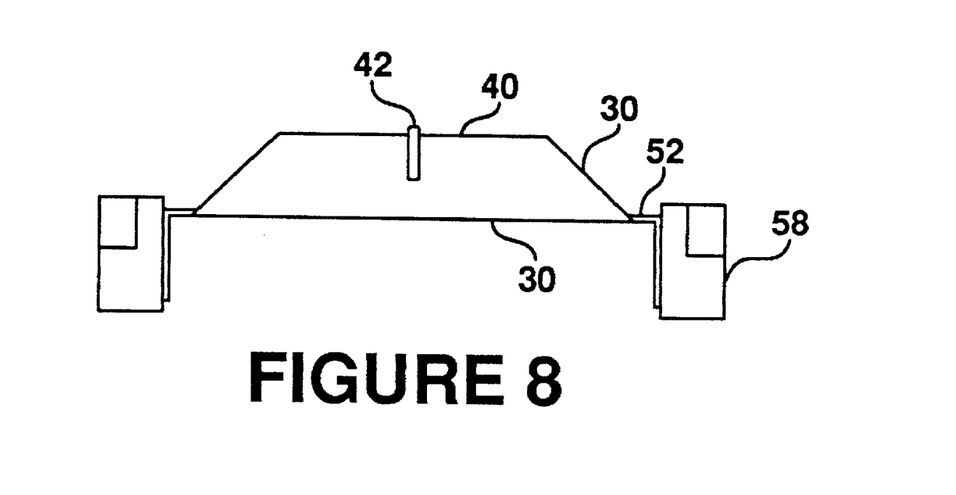

As shown in FIG. 8, a cable according to the present invention can be constructed using right-angle connectors where the flex circuit 30 is bent downward at a right angle within the planar region 52 and attached to a right-angle connector 58. The resulting cable has a side profile quite similar to that of the cable shown in FIGS. 2–6 which uses stacking connector 36, 38.

Figure 9:
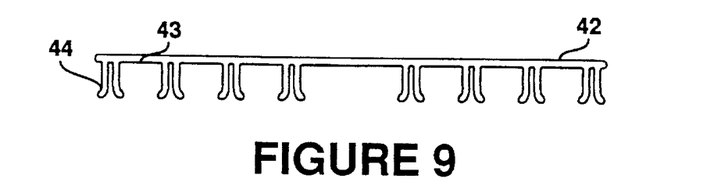
FIG. 9 is a side view of the vane stabilizer shown in FIGS. 2–6.

Referring now to FIG. 9, the comb stabilizer 42 has a longitudinal member 43 having pairs of teeth 44 attached thereto. The stabilizer 42 can be made from metal with the teeth being flexibly biased toward each other. The gaps 45 between the pairs of teeth are preferably the same width as the thickness of the flex circuit 30. Alternatively, a stabilizer having a single tooth per vane 44 could be used, with each vanes adhered to a respective tooth.

Figure 10:
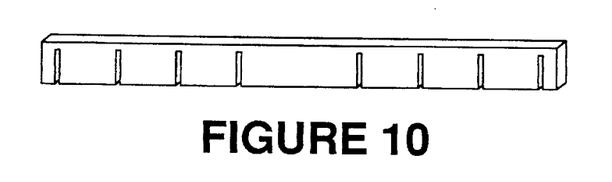
FIG. 10 is a side view of another vane stabilizer.

Other types of stabilizers can be used to hold the vanes 40 in place. Referring now to FIG. 10, a vane stabilizer 60 may be made from a thin, glass-epoxy board having slits 62 spaced along its length. The slits are approximately the same width as the thickness of the vanes 40 of the flex circuit 30. The vanes are inserted into the slits and glued in place.

Figure 11:
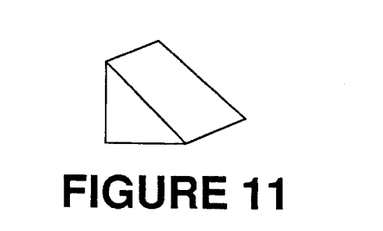
FIG. 11 is a perspective view of a vane stabilizer block.

Rather than using a single stabilizer bisecting the middle of the vanes 40, a plurality of stabilizer "blocks" can be used. Referring now to FIG. 11, an individual block 64 has a width 66 that matches the distance between the vanes can be glued to the vanes and common plane 41 of the flex circuit 30 within its transition region 50. As shown in the drawing, the blocks may be shaped to have an angle 68 that matches the angle of the vanes.

Figure 12:
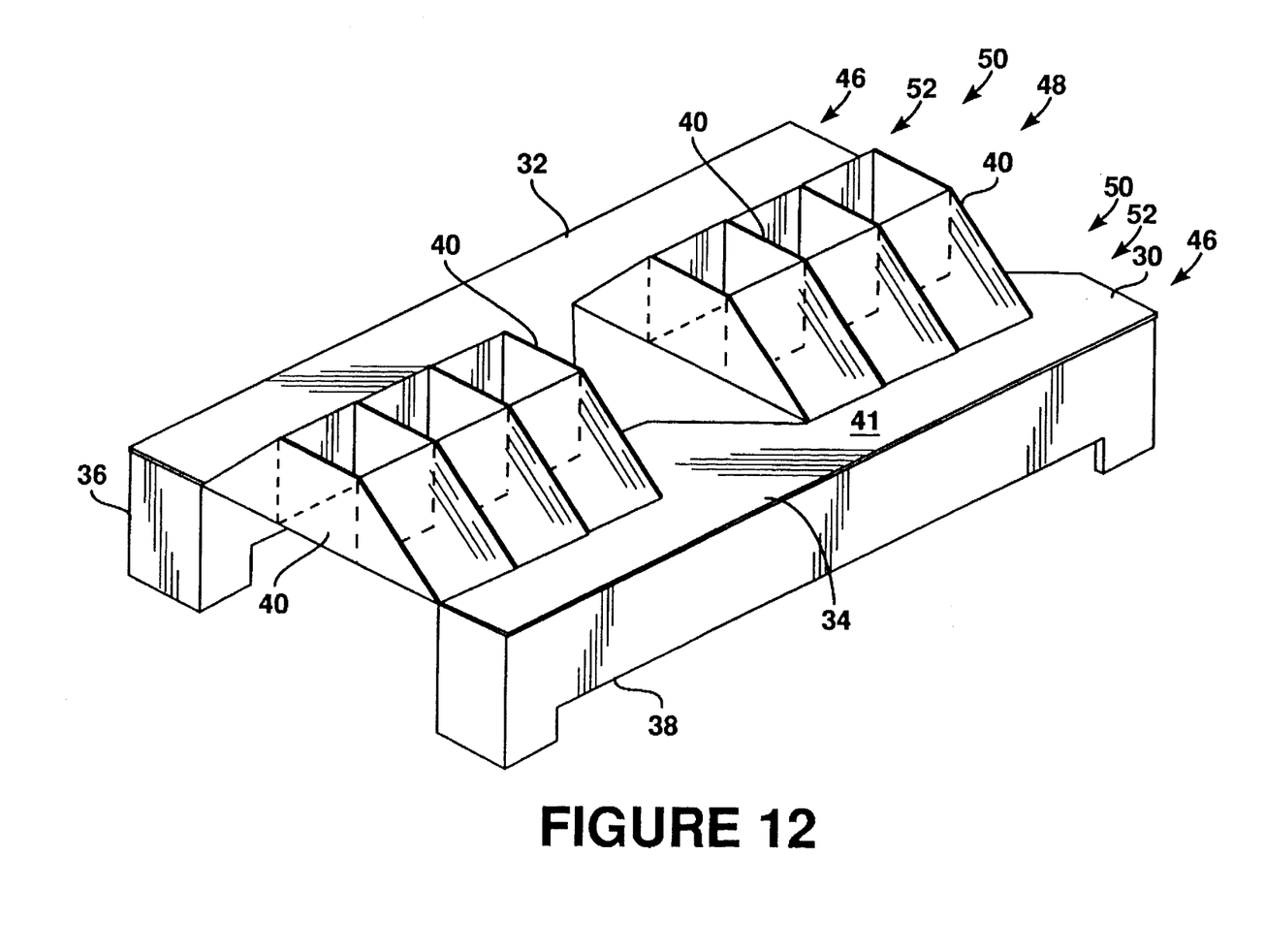
FIG. 12 is a perspective view of the cable shown in FIG. 2–6 using a plurality of stabilizer blocks such as shown in FIG. 11.

The perspective view of FIG. 12 shows a parallel flexible transmission cable having a plurality of blocks 64 stabilizing the vanes 40 orthogonal to the common plane 41.

Figure 13:
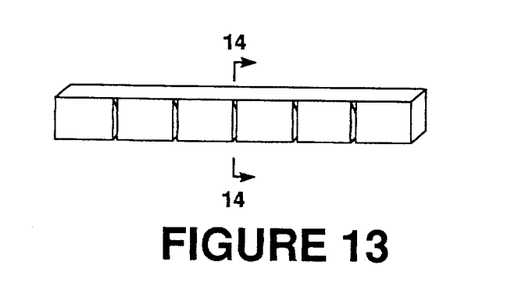
FIG. 13 is a perspective view of an integral vane stabilizer bar.
Figure 14:
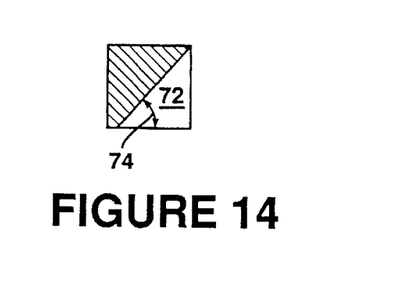
FIG. 14 is a sectional view of the integral vane stabilizer block shown in FIG. 13 taken along line 14—14.

Refer now to the drawing of FIG. 13. Instead of individual blocks 64, a solid stabilizer bar 70 having a plurality of angled slits 72 can be attached to the flex circuit 30 at its transition region 50. The width of the slits is approximately the same width as the thickness of the vanes 40 and are spaced along the length of the stabilizer bar to match the spacing of the vanes. Preferably, two stabilizer bars would be used, one at each end of the vanes. The sectional view of FIG. 14 shows how the slits 72 are formed at an angle 74 which matches the angle of the ends of the vanes.

Figure 2:
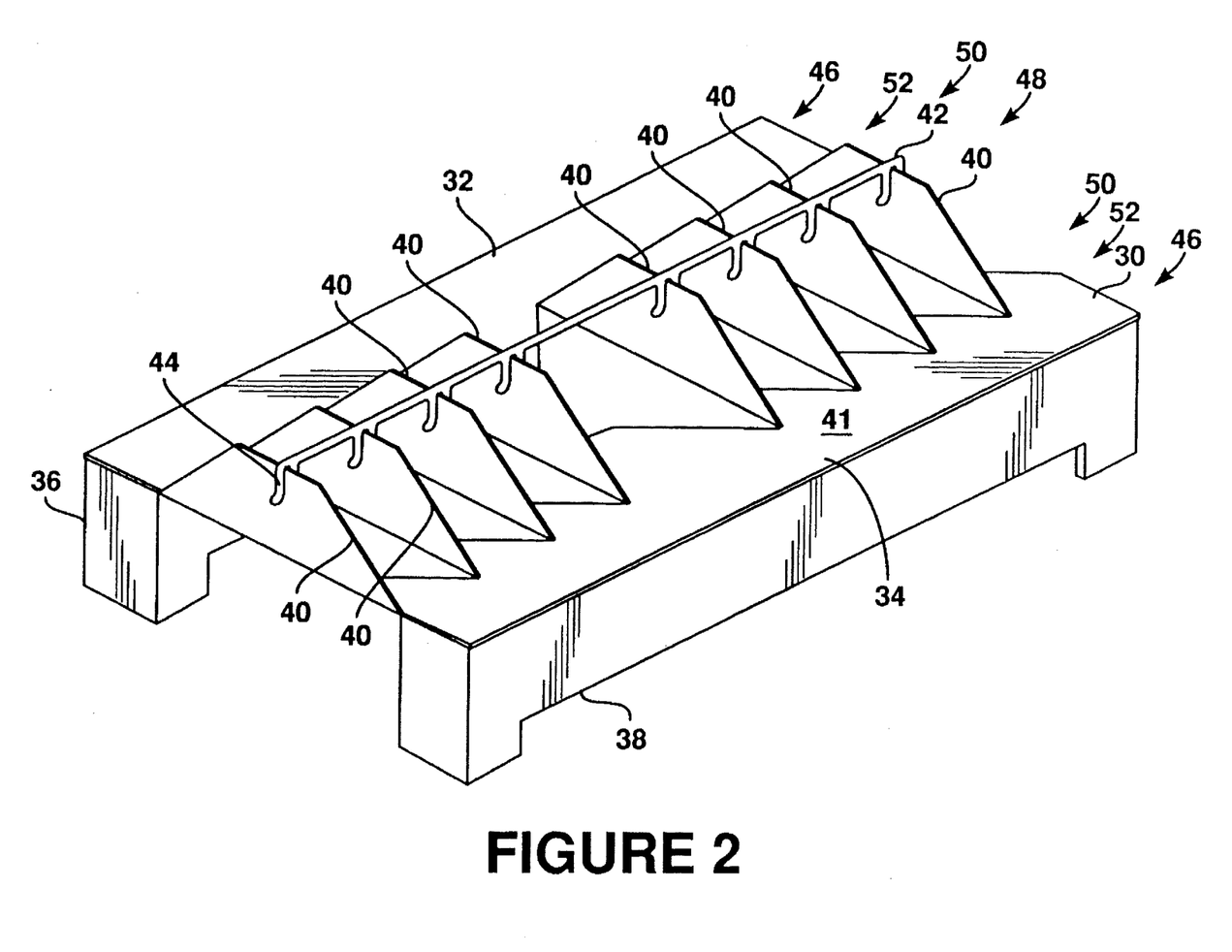
FIG. 2 is a perspective view of an exemplary parallel flexible transmission cable according to the present invention.
Figure 15:
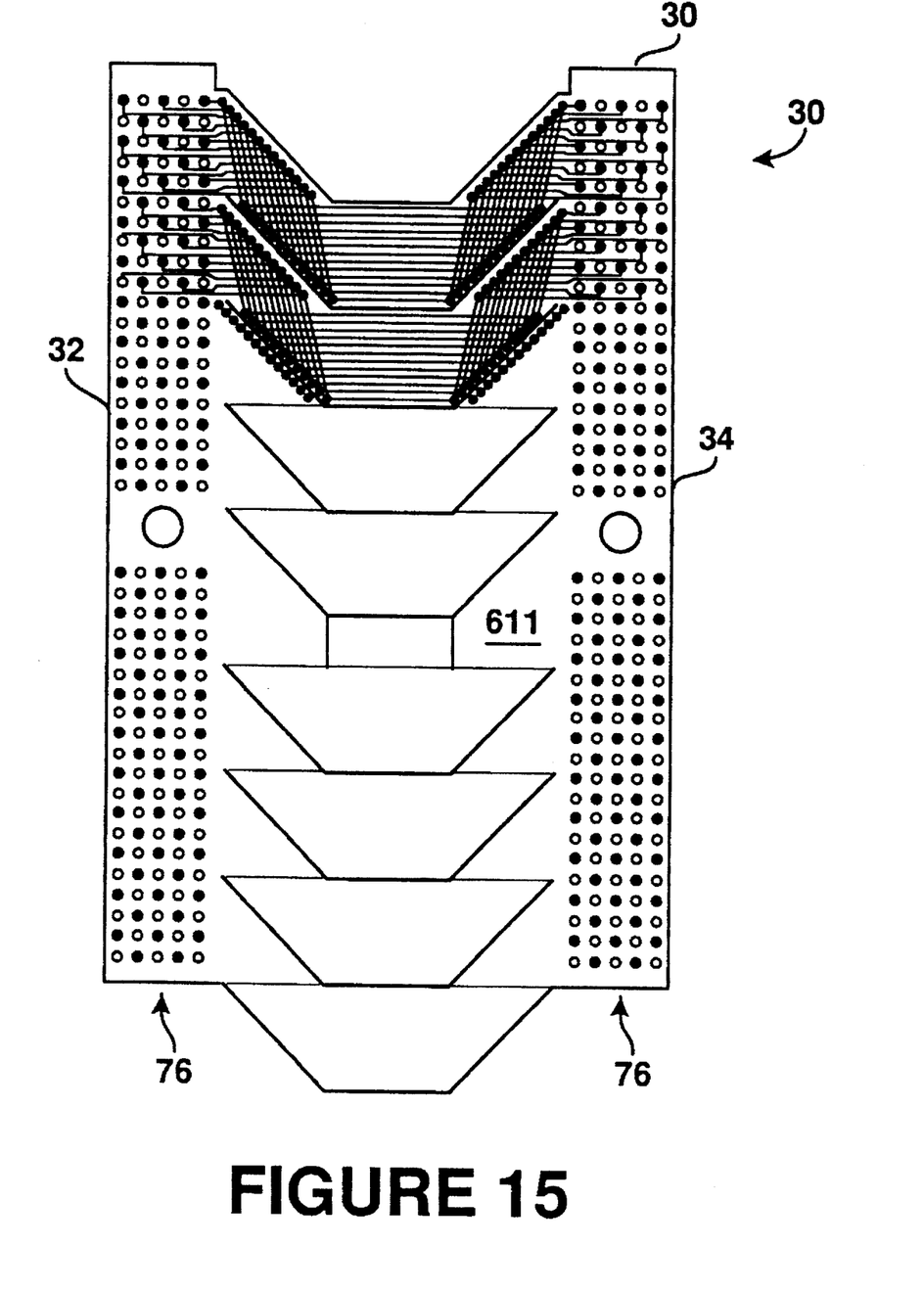
FIG. 15 is a plan view of the inner two layers of the flex circuit assembly portion of the cable during construction.

Referring now to FIG. 15, the flex circuit 30 is constructed from a four-layer board. The two inner layers of the flex circuit contain conductors or "traces" for transmitting signals between the connectors 36, 38 (FIG. 2). The two outer layers are solid copper ground planes. For clarity, the outer two layers are not shown in FIG. 15.

A plurality of connector vias 74 are arranged in a regular matrix 76 at each end 32, 34 of the flex circuit assembly 30. The matrix matches the pin layout of the connectors 36, 38 (FIGS. 2–5).

In the embodiment shown, one-half of the pins and vias are grounded and are depicted by the hollow circles. The grounded vias are connected to the ground planes of the outer layers. The remaining pins carry the signals of interest to be transmitted to a corresponding pin on the other connector and are depicted by the filled circles. There need not be a mirror relationship between the connectors 36, 38.

In a completed physical cable, including the two outer layers, the ground vias and the signal vias would appear identical to each other. In this exemplary configuration, the ground and signal pins are arranged in a "checkerboard" pattern to minimize crosstalk between adjacent signal pins.

An important consideration in the design of a parallel flexible transmission cable for use in high-speed systems is the amount of time required for signals to traverse the length of the cable. To simplify circuit design, it is important that signals traverse the cable in the same amount of time, regardless of what set of conductors they follow on the cable. This reduces the timing "skew" between signals within a bus. This is achieved by "length-equalizing" the cable, that is, the distance a signal travels between respective pins of the two connectors is designed to be virtually the same for all pairs of pins.

Figure 16:
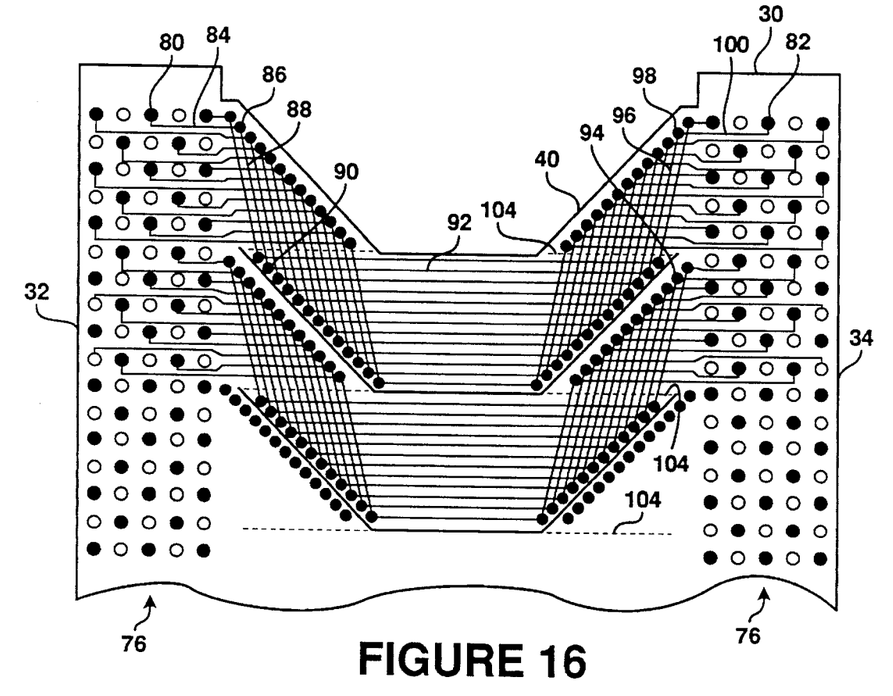
FIG. 16 is an enlarged partial view of the flex circuit assembly shown in FIG. 15.

Refer now to FIG. 16, where an enlarged view of the inner two layers of the flex circuit is shown. At each end 32, 34 of the flex circuit 30 is the matrix 76 of vias. These vias connect the different layers of the flex circuit to the pins of the connectors 36, 38. The top five rows of vias for each connector include thirteen signal vias and twelve ground vias. Each signal via is connected to a respective signal via at the other end of the cable by a conductor or trace that alternates five times between the two inner layers of the flex circuit 30 as it routes from one connector to the other. The conductors for the thirteen signal vias are routed on one of the vanes 40. The ground vias connect the ground pins of the connectors to the outer layers, or ground planes, of the parallel flexible transmission cable.

For example, a first signal via 80 on the top of the left end 32 of the flex circuit 30 is connected to a corresponding signal via 82 on the right end 34 of the cable by means of a first connector conductor 84, a first transition via 86, a first transition conductor 88, a first vane via 90, a vane conductor 92, a second vane via 94, a second transition conductor 96, a second transition via 98, and a second connector conductor 100.

Figure 17:
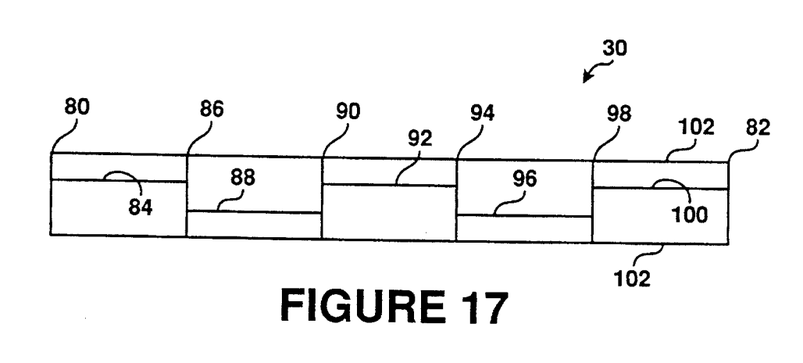
FIG. 17 is a simplified stackup view of the flex circuit assembly shown in FIG. 16.

A stackup of this example is shown in FIG. 17. The connector and vane conductors 84, 92, 100 are coplanar with each other and are on a first inner layer of the flex circuit 30. The transition conductors 88, 96 are on a second inner layer. Thus the conductors can cross over each other as shown in FIGS. 15 and 16 without being electrically connected. The stackup of FIG. 17 also shows the ground planes 102. The ground planes 102 alternatively could be power planes.

Referring again to FIGS. 16 and 17, the vanes 40 are separated from each other by cutting the flex circuit 30 along the lines that divide them. Stress relief holes may be drilled at the ends of the cuts or the ends of the cuts may be rounded to prevent the flex circuit from tearing under stress.

After cutting, the vanes 40 are bent along the dotted lines 104 until the vanes are orthogonal to the common plane 41 of the flex circuit 30.

The angles between corresponding conductors on the inner layers, such as between the first transition conductor 88 and the vane conductor 92, are greater than ninety degrees. The close spacing of the vias in the connector matrices 76 and the requirement that the vanes 40 be beyond the fold lines 104 necessitates that the vane vias 90, 94 be offset toward the middle of the length of the flex cable 30. However, the symmetric arrangement of the conductors ensures that the effective lengths between corresponding connector vias are substantially equal.

Figure 19:
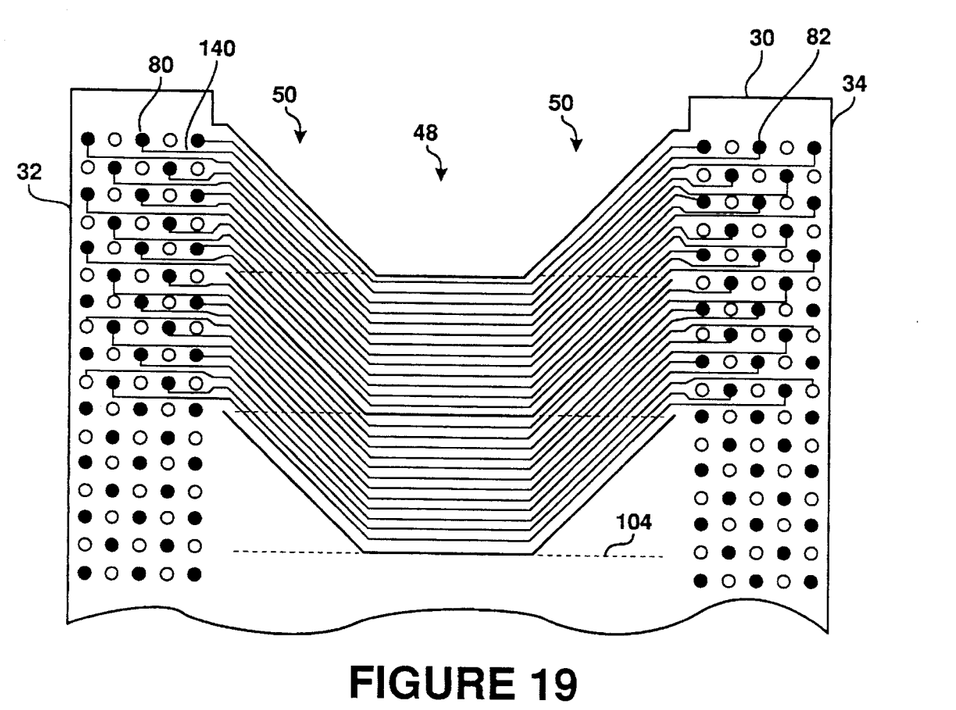
FIG. 19 is an enlarged partial view of the flex circuit similar to that shown in FIG. 15, but having an alternative routing of its conductors.

The cable of FIGS. 16 and 17 shows a layout using only straight conductors. Because the layout crosses the conductors, at least two layers of the flex circuit 30 are used for routing the conductors. Referring now to FIG. 19, where an alternative routing layout for the flex circuit 30 is shown. In this layout, the conductors are routed beside each other the whole length of the cable. In this layout, the conductors do not cross, thereby requiring only one layer of the flex circuit for the signal conductors. Consider, for illustrative purposes, the interconnection of vias 80 and 82 at opposite ends 32, 34 of the flex circuit. A single conductor 140 connects the two vias and does not cross any other conductor. Instead it is parallel to other conductors both within the transition regions 50 and the vane region 48.

The layout of FIG. 19 requires only one layer for signal-carrying conductors. Alternately, with two conductor layers, alternating conductors could be routed on the two layers, thereby increasing the spacing between adjacent conductors, and thus decreasing crosstalk.

A parallel flexible transmission cable according to the present invention may be made using ribbon cable. Typically, ribbon cable has sufficient flexibility to accommodate typical misalignments of mating connectors. However, if a ribbon cable is relatively wide compared to its length, its flexibility is greatly decreased.

Figure 18:
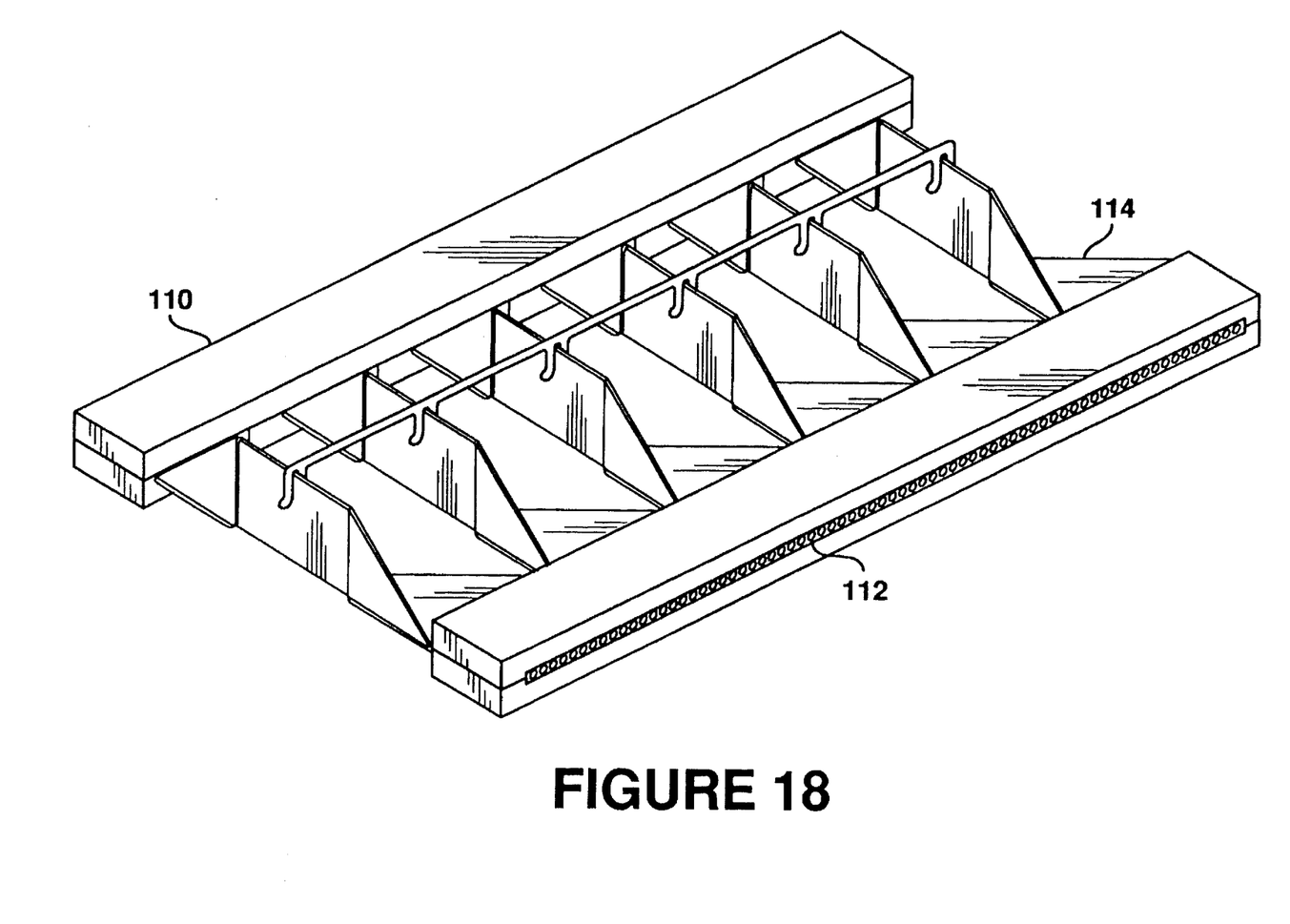
FIG. 18 is a perspective view of a second exemplary parallel flexible transmission cable according to the present invention.

Referring now to FIG. 18, this embodiment includes a pair of connectors 110, 112 attached to opposite ends of a ribbon cable 114. The connectors may be the mass terminating type of connectors that easily connect each conductor of the ribbon cable to a respective contact in the connector upon assembly.

At regular intervals, the ribbon cable 114 is slit between pairs of conductors, forming ribbon cable sections 116. The ribbon cable need not be slit its entire length, but may be slit the entire distance between the connectors 110, 112.

Each ribbon cable section 116 is folded over and back along two fold lines angled at 45 degrees to the length of the cable, thereby displacing the center portion of each ribbon cable section by its width. Adhesive can hold the folds in place. The displaced center portions are then bent to be orthogonal to the common plane 118 of the ribbon cable. The resulting center portion form "vanes" which can be stabilized parallel to and equidistant from each other using any of the stabilizers discussed above in reference to FIGS. 9–14.

The drawing shows the folds angled at 45 degrees to the length of the cable. Other angles may be used, increasing the total length of ribbon cable required or decreasing the length of the intermediate region.

In the description given above, the parallel flexible transmission cables have been shown having a plurality of vanes. A single vane could be used to achieve the invention's advantage of flexibility in two degrees. Multiple vanes decrease the overall height of the cable.

A cable need not have the approximate dimensions or proportions of the disclosed cables. Longer or shorter cables may be constructed, as well as cables having fewer or greater conductors.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

I claim:

1. A parallel flexible transmission cable comprising:

two connectors, each connector having a plurality of contacts; and a flexible cable having two ends, a first vane between the two ends, and a plurality of conductors connected between respective contacts of the two connectors, where a first portion of the flexible cable is within a first plane at a first one of the two connectors, a second portion of the flexible cable is within a second plane at a second one of the two connectors, and where the first vane is within a third plane between the two connectors, where the third plane is orthogonal to the first and second planes.

2. The parallel flexible transmission cable of claim 1, wherein the first and second planes are coplanar.

3. The parallel flexible transmission cable of claim 1, wherein the flexible cable further includes a second vane between the two ends, and the second vane is within a fourth plane, where the fourth plane is parallel to the third plane.

4. The parallel flexible transmission cable of claim 3, further comprising a stabilizer adapted to hold the first and second vanes of the flexible cable in a parallel relationship.

5. The parallel flexible transmission cable of claim 3, wherein the flexible cable is fabricated from a flexible circuit board.

6. The parallel flexible transmission cable of claim 5, wherein the plurality of conductors are all substantially the same length.

7. The parallel flexible transmission cable of claim 1, wherein the flexible cable is fabricated from a flexible circuit board.

8. The parallel flexible transmission cable of claim 6, wherein the plurality of conductors are all substantially the same length.

9. A parallel flexible transmission cable, comprising:

two connectors, each connector having a plurality of contacts;

a flexible circuit board having two ends and a vane between the two ends, where each of the two connectors are attached to a respective end of the flexible circuit board;

a plurality of conductors within the flexible circuit board, where the conductors are connected between respective contacts of the two connectors;

where a first portion of the flexible circuit board is within a first plane at a first one of the two connectors and a second portion of the flexible circuit board is within a second plane at a second one of the two connectors, the vane is within a third plane, and where the third plane is orthogonal to the first and second planes.

10. The parallel flexible transmission cable of claim 9, wherein the flexible circuit board includes at least two layers, where the plurality of conductors are on a first of the layers and a second of the layers includes a conductive ground plane.

11. The parallel flexible transmission cable of claim 10, wherein the flexible circuit board includes at least three layers, where a third layer includes a conductive ground plane, the second layer being interposed between the first layer and the third layer.

12. The parallel flexible transmission cable of claim 9, wherein the flexible circuit board includes at least four layers, where the plurality of conductors are on a first and a second of the layers, and a third and a fourth of the layers include respective conductive ground planes, where the first and second layers are interposed between the third and fourth layers.

13. The parallel flexible transmission cable of claim 12, wherein the plurality of conductors are all the same length.

14. The parallel flexible transmission cable of claim 9, wherein the plurality of conductors are all the same length.

15. A parallel flexible transmission cable, comprising:

two connectors;

a flexible circuit board having two ends and a plurality of vanes between the two ends, where each of the connectors is attached to a different respective end of the flexible circuit board;

a plurality of conductors within the flexible circuit board, where the conductors are connected between respective contacts of the two connectors;

where a first portion of the flexible circuit board is within a first plane at a first one of the two connectors and a second portion of the flexible circuit board is within a second plane at a second one of the two connectors, and where the vanes are in respective planes parallel to each other and are orthogonal to the first and second planes.

16. The parallel flexible transmission cable of claim 15, wherein the flexible circuit board includes at least two layers, where the plurality of conductors are on a first of the layers and a second of the layers includes a conductive ground plane.

17. The parallel flexible transmission cable of claim 16, wherein the flexible circuit board includes at least three layers, where a third layer includes a conductive ground plane, the second layer being interposed between the first layer and the third layer.

18. The parallel flexible transmission cable of claim 15, wherein the flexible circuit board includes at least four layers, where the plurality of conductors are on a first and a second of the layers, and a third and a fourth of the layers includes respective conductive ground planes, where the first and second layers are interposed between the third and fourth layers.

19. The parallel flexible transmission cable of claim 18, wherein the plurality of conductors are substantially all the same length between the respective contacts.

* * * * *